(12) United States Patent
Li et al.

(10) Patent No.: US 7,514,854 B2
(45) Date of Patent: Apr. 7, 2009

(54) PIEZOELECTRIC ELEMENT, LIQUID-JET HEAD USING PIEZOELECTRIC ELEMENT AND LIQUID-JET APPARATUS

(75) Inventors: Xin-Shan Li, Nagano-ken (JP); Koji Sumi, Nagano-ken (JP); Masami Murai, Nagano-ken (JP); Tsutomu Nishiwaki, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 141 days.

(21) Appl. No.: 11/391,331

(22) Filed: Mar. 29, 2006

(65) Prior Publication Data

US 2006/0261708 A1    Nov. 23, 2006

(30) Foreign Application Priority Data

Mar. 30, 2005 (JP) ............................. 2005-097326
Dec. 1, 2005 (JP) ............................. 2005-347961

(51) Int. Cl.
H01L 41/18 (2006.01)
(52) U.S. Cl. ..................................... 310/358
(58) Field of Classification Search ................. 310/358
See application file for complete search history.

(56) References Cited

U.S. PATENT DOCUMENTS

| | | | |
|---|---|---|---|
| 2004/0135851 A1* | 7/2004 | Xin-Shan et al. | 347/68 |
| 2004/0189751 A1* | 9/2004 | Kanno et al. | 347/68 |
| 2005/0012784 A1* | 1/2005 | Ito | 347/68 |
| 2006/0118840 A1* | 6/2006 | Ezhilvalavan et al. | 257/295 |

FOREIGN PATENT DOCUMENTS

| | | |
|---|---|---|
| JP | 11-26832 A | 1/1999 |
| JP | 11-228227 A | 8/1999 |
| JP | 11-228228 A | 8/1999 |
| JP | 11-278929 A | 10/1999 |
| JP | 2001-284671 A | 10/2001 |
| JP | 2004-59369 A | 2/2004 |
| JP | 2004-307320 A | 11/2004 |

OTHER PUBLICATIONS

Duane Dimos, Robert W. Schwartz and Steven J. Lockwood—Control of leakage Resistance in Pb (Zr, Ti) O₃ Thin Films by Donor Doping, Nov. 1994.

(Continued)

Primary Examiner—Quyen P Leung
Assistant Examiner—Derek J Rosenau
(74) Attorney, Agent, or Firm—Sughrue Mion, PLLC (57) ABSTRACT

Disclosed are a piezoelectric element in which crystallinity of a piezoelectric layer is improved, and which has uniform characteristics of the piezoelectric layer, a liquid-jet head using the piezoelectric element as well as a liquid-jet apparatus. The piezoelectric element includes: a lower electrode provided to one surface side of a substrate; a piezoelectric layer which is made of a piezoelectric material containing lead (Pb), zirconium (Zr) and titanium (Ti), and which is provided above the lower electrode; and an upper electrode provided above the piezoelectric layer, and in the piezoelectric element, a relative permittivity of the piezoelectric layer is 750 to 1500 and a coercive electric field of the piezoelectric layer is 10 to 40 kV/cm.

17 Claims, 10 Drawing Sheets

OTHER PUBLICATIONS

Zhan Jie Wang, et al., "Effect of Bottom Electrodes on Microstructures and Electrical Properties of Sol-Gel Derived $Pb(Zr_{0.50}Ti_{0.47})O_3$ Thin Films" Thin Solid Films 416 (2002) pp. 66-71.

Zhan Jie Wang, et al., "Deposition of $Pb(Zr_xTi_{1-x})O_3$ Thin Films by Pulsed Laser Ablation for MEMS Application", Proceedings of SPIE—The International Society for Optical Engineering, vol. 4934 (2002), pp. 356-363.

* cited by examiner

PIEZOELECTRIC ELEMENT, LIQUID-JET HEAD USING PIEZOELECTRIC ELEMENT AND LIQUID-JET APPARATUS

The entire disclosure of Japanese Patent Application Nos. 2005-097326 filed Mar. 30, 2005 and 2005-347961 filed Dec. 1, 2005 is expressly incorporated by reference herein.

BACKGROUND OF THE INVENTION

1. Field of the Invention

The present invention relates to a piezoelectric element including a piezoelectric layer formed of a piezoelectric material, and a liquid-jet head using the piezoelectric element as well as a liquid-jet apparatus.

2. Description of the Prior Art

A piezoelectric element is configured in a manner that a piezoelectric layer is interposed between two electrodes. The piezoelectric layer is made of, for example, a piezoelectric material showing an electrical mechanical conversion function. Alternatively, the piezoelectric layer is configured of, for example, crystallized piezoelectric ceramics.

There has been an inkjet recording head with the following configuration, as a liquid-head jet using such a piezoelectric element. In accordance with the configuration, a part of pressure generating chambers communicating with nozzle orifices from which ink droplets are ejected is constructed with a vibration plate. The vibration plate is deformed by piezoelectric elements, and thus ink in each of the pressure generating chambers is pressurized. Accordingly, ink droplets are ejected from each of the nozzle orifices. Two types of inkjet recording heads have been put into practical use. One of the two types uses a piezoelectric actuator of a longitudinal vibration mode in which the piezoelectric actuator expands and contracts in a longitudinal direction of piezoelectric elements. The other type uses a piezoelectric actuator of a flexure vibration mode.

As the inkjet recording head using the actuator of the flexure vibration mode, for example an inkjet recording head formed in the following manner has been known. An even piezoelectric layer is formed on the entire surface of a vibration plate by use of a film-forming technique. Then, this piezoelectric layer is cut into shapes corresponding to the pressure generating chambers by a lithography method. Thereby, the piezoelectric elements are formed respectively in the pressure generating chambers in a manner that the piezoelectric can be independent from one another.

Furthermore, as a piezoelectric layer (piezoelectric film) configuring such a piezoelectric element, there has been one made of lead zirconate titanate (PZT) (see Japanese Patent Laid-Open Official Gazette No. 2001-284671, for example). In this regard, various characteristics, such as displacement characteristics and durability, of the piezoelectric element including such a piezoelectric layer are largely dependent on crystallinity of the piezoelectric layer. Also in Japanese Patent Laid-Open Official Gazette No. 2001-284671, a relative permittivity, a coercive electric field and the like are regulated. However, it cannot be said that such a piezoelectric element disclosed in Japanese Patent Laid-Open Official Gazette No. 2001-284671 has sufficient crystallinity.

Note that, such problems are not limited to piezoelectric elements each installed in an inkjet recording head. It goes without saying that the problems are similarly present in other piezoelectric elements each installed in a liquid-jet head.

SUMMARY OF THE INVENTION

With the aforementioned conditions taken into consideration, an object of the present invention is to provide a piezoelectric element in which crystallinity of a piezoelectric layer is improved, and which has uniform characteristics of the piezoelectric layer, a liquid-jet head using a piezoelectric element as well as a liquid-jet apparatus.

A first aspect of the present invention for the purpose of solving the aforementioned problems is a piezoelectric element characterized by including: a lower electrode provided to one surface side of a substrate; a piezoelectric layer which is made of a piezoelectric material containing lead (Pb), zirconium (Zr) and titanium (Ti), and which is provided above the lower electrode; and an upper electrode provided above the piezoelectric layer. The piezoelectric layer is characterized in that a relative permittivity of the piezoelectric layer is 750 to 1500, and a coercive electric field of the piezoelectric layer is 10 to 40 kV/cm.

In the first aspect, crystallinity of the piezoelectric layer is significantly improved. Accordingly, it is possible to provide a piezoelectric element which is excellent in displacement characteristics, and which has a high withstand voltage and a longer durability life.

A second aspect of the present invention is the piezoelectric element according to the first aspect, which is characterized in that the coercive electric field of the piezoelectric layer is 20 to 30 kV/cm and a residual polarization intensity of the piezoelectric layer is 10 to 15 $\mu C/cm^2$.

In the second aspect, the crystallinity of the piezoelectric layer achieves greater excellence, and the displacement characteristics and durability life of the piezoelectric layer are further improved.

A third aspect of the present invention is the piezoelectric element according to the first aspect, which is characterized in that the film thickness of the piezoelectric layer is 0.5 to 5 μm.

In the third aspect, the crystallinity of the piezoelectric layer is improved significantly without fault.

A fourth aspect of the present invention is the piezoelectric element according to the first aspect, which is characterized in that a composition ratio of the piezoelectric layer meets conditions of Pb/(Zr+Ti)=1.05 to 1.5 and Zr/Ti=53/47 to 75/25.

In the fourth aspect, by adjusting the composition ratio of the piezoelectric layer to be within a predetermined range, it is possible to improve the crystallinity of the piezoelectric layer further.

A fifth aspect of the present invention is a piezoelectric element according to first aspect, which is characterized in that the piezoelectric material is lead zirconate titanate.

In the fifth aspect, it is possible to provide the piezoelectric element which is excellent in displacement characteristics and durability.

A sixth aspect of the present invention is a liquid-jet head characterized by including: the piezoelectric element according to of the first aspect; and a passage-forming substrate, in which the piezoelectric element is provided to one surface side of the passage-forming substrate, and to which a pressure generating chamber communicating with a nozzle orifice is provided.

In the sixth aspect, since the displacement characteristics and durability life of the piezoelectric element are improved, it is possible to provide a liquid-jet head with excellent reliability.

A seventh aspect of the present invention is a liquid-jet head characterized by including the liquid-jet head according to the sixth aspect.

In the seventh aspect, it is possible to provide a liquid-jet apparatus which is excellent in durability and reliability.

DESCRIPTION OF THE PREFERRED EMBODIMENTS

Hereinafter, detailed descriptions will be provided for the present invention on a basis of embodiments.

First Embodiment

Figure 1:
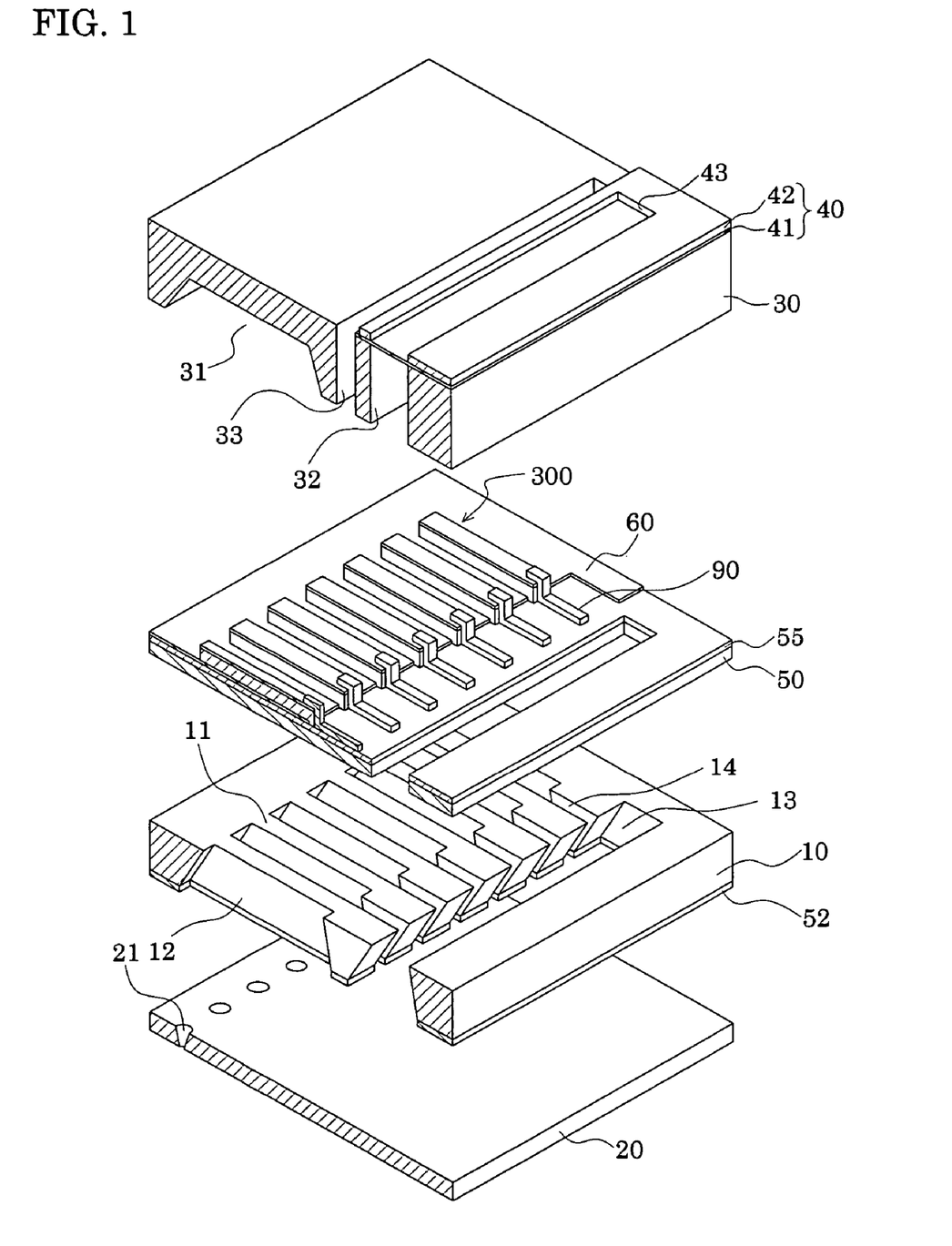
FIG. 1 is an exploded perspective view showing a schematic configuration of a recording head according to a first embodiment.
Figure 2A:
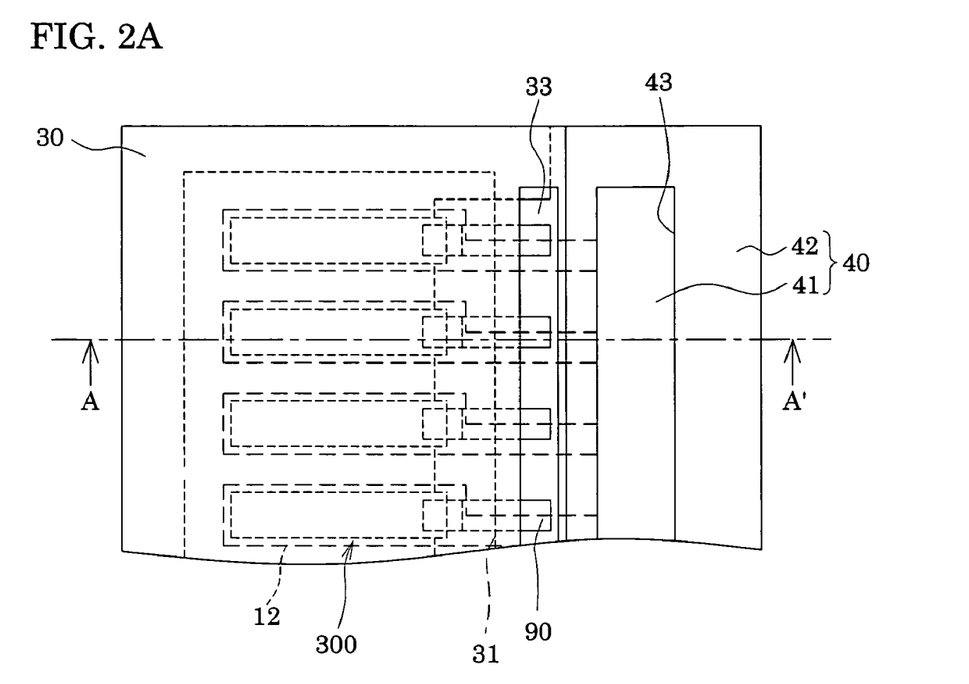
FIGS. 2A and 2B are respectively plan and cross-sectional views of the recording head according to the first embodiment.
Figure 2B:
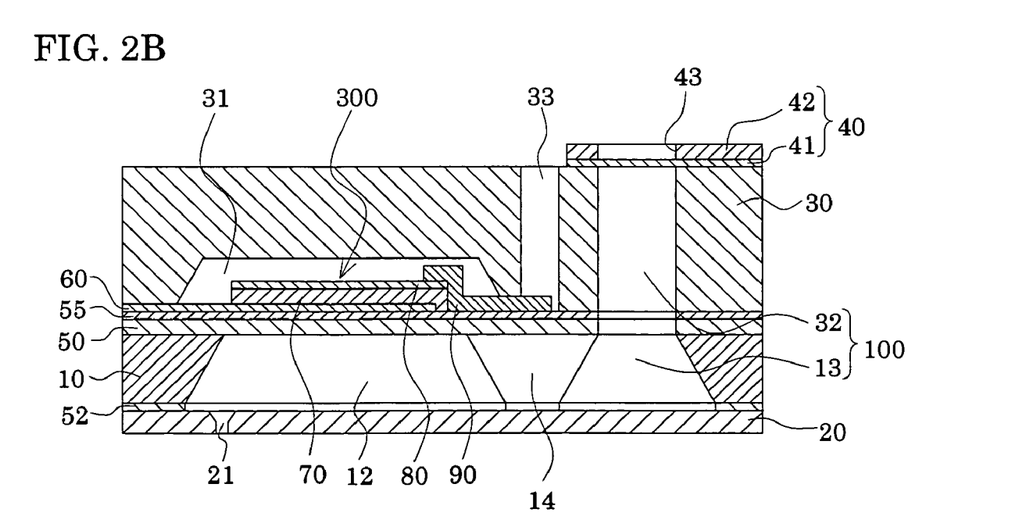

FIG. 1 is an exploded perspective view showing a schematic configuration of an inkjet recording head according to a first embodiment of the present invention. FIG. 2A is a plan view of the inkjet recording head shown in FIG. 1, and FIG. 2B is a cross-sectional view of the inkjet recording head taken along the A-A' line of FIG. 2A. In this embodiment, a passage-forming substrate 10 is formed of a single crystal silicon substrate in which crystals are oriented to the (110) plane direction. An elastic film 50 is formed on one of the two surfaces of the passage-forming substrate 10, as illustrated. The elastic film 50 has a thickness of 0.5 to 2 μm, and is made of silicon dioxide beforehand formed by thermal oxidation. In the passage-forming substrate 10, a plurality of pressure generating chambers 12 compartmentalized by compartment walls 11 are arranged side-by-side in the width direction of the pressure generating chambers 12. In a region outside the pressure generating chambers 12 in the longitudinal direction, a communicating portion 13 is formed, the pressure generating chambers 12 being of the passage-forming substrate 10. The communicating portion 13 communicates with each of the pressure generating chambers 12 through each of ink supply paths 14 respectively provided to the pressure generating chambers 12. Incidentally, the communicating portion 13 constitutes a part of a reservoir which will be a common ink chamber for each of the pressure generation chambers 12 while communicating with a reservoir portion of a protection substrate which will be described later. Each of the ink supply paths 14 is formed with a width narrower than that of the pressure generating chamber 12, and thus keeps constant the passage resistance of ink flowing from the communicating portion 13 to the pressure generating chamber 12.

Concurrently, a nozzle plate 20 is fixed to an aperture surface of the passage-forming substrate 10 with a mask film 52 interposed in between by use of an adhesive agent, a thermal adhesive film or the like. The mask film 52 will be described later. In the nozzle plate 20, nozzle orifices 21 are drilled. The nozzle orifices 21 communicate respectively with the pressure-generating chambers 12 at vicinity of ends of the pressure-generating chambers 12, which ends are opposite the ink supply paths 14. Incidentally, the nozzle plate 20 is formed of, for example, glass ceramics, single crystal silicon substrate, stainless steel or the like.

On the other hand, as described above, the elastic film 50 is formed on the other surface of the passage-forming substrate 10 which is the side opposite the aperture surface. The elastic film 50 has a thickness of, for example, approximately 1.0 μm, and is made of silicon dioxide. An insulation film 55 is formed on this elastic film 50 by laminating the insulation film 55 over this elastic film 50. The insulation film 55 has a thickness of approximately 0.4 μm, and is made of zirconia ($ZrO_2$) and the like. Furthermore, piezoelectric elements 300 are formed on this insulation film 55. Each of the piezoelectric elements 300 is configured of a lower electrode film 60, a piezoelectric layer 70 and an upper electrode film 80. The lower electrode film 60, the piezoelectric layer 70 and the upper electrode 80 have thicknesses of, for example, approximately 0.1 to 0.2 μm, approximately 0.5 to 5 μm and approximately 0.05 μm respectively.

In general, the piezoelectric element 300 is configured in the following manner. One of the two electrodes of the piezoelectric element 300 is used as a common electrode. The other electrode and the piezoelectric layer 70 are patterned in each of the pressure generating chambers 12. In a portion constituted of a patterned piezoelectric layer 70 and a corresponding patterned one of the two electrodes, a piezoelectric strain occurs due to application of a voltage to the two electrodes. This portion is called a "piezoelectric active portion". In this embodiment, the lower electrode film 60 is used as a common electrode for the piezoelectric elements 300, and the upper electrode films, 80 are used as individual electrodes of the piezoelectric elements 300. However, it does not matter whether the use is the other way round for convenience of a drive circuit and wiring. In both cases, the piezoelectric active portions are formed respectively the pressure generating chambers 12.

Additionally, a lead electrode 90 is connected to each of the upper electrode films 80 of such piezoelectric elements 300. The lead electrode 90 is made of, for example, gold (Au) and the like. A voltage is selectively applied to each of the piezoelectric elements 300 through the lead electrode 90.

Figure 3:
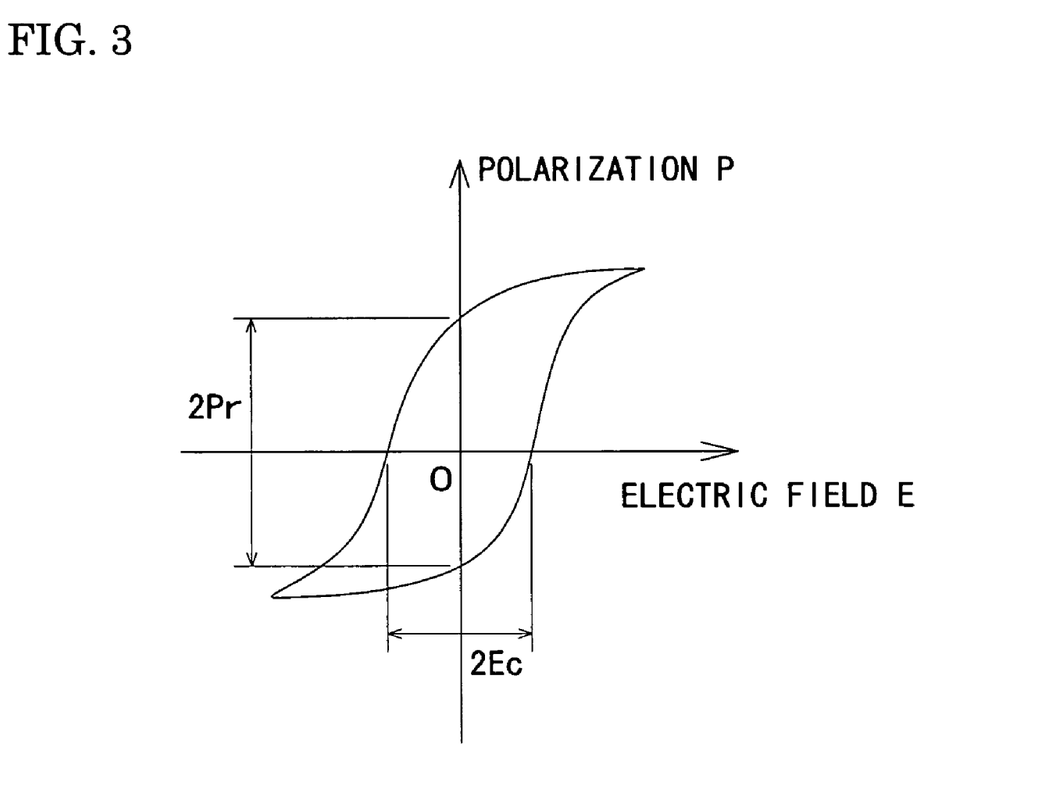
FIG. 3 is a chart showing an example of a hysteresis loop of a piezoelectric layer.

Incidentally, each of the lower electrode film 60 and the upper electrode film 80, which constitute the piezoelectric element 300, are made of metallic materials each having a relatively high electrical permittivity. The metallic materials are, for example, platinum (Pt), iridium (Ir) and the like. Additionally, the piezoelectric layer 70 is made of a piezoelectric material containing at least lead (Pb), zirconium (Zr) and titanium (Ti). In this embodiment, for example, the piezoelectric layer 70 is made of lead zirconate titanate (PZT) Incidentally, such a piezoelectric layer 70 has characteristics that a relative permittivity thereof is 750 to 1500, and a coercive electric field hereof is Ec=10 to 40 kV/cm (2Ec=20 to 80 kV/cm). Note that the coercive electric field Ec of the piezoelectric layer 70 is a value, for example, obtained by use of 2Ec of a hysteresis loop of a piezoelectric layer as shown in FIG. 3.

With respect to the piezoelectric layer 70 having such characteristics, the piezoelectric constant thereof reach a higher degree of excellence. Specifically, the piezoelectric constant $d_{31}$ is 150 to 250 (pC/N). Accordingly, displacement characteristics of the piezoelectric element 300 improve. Incidentally, since the piezoelectric layer 70 with such characteristics is excellent in crystallinity, characteristics thereof such as a withstand voltage are significantly improved. Accordingly, if the displacement characteristics of the piezoelectric element 300 are improved, the durability life thereof is significantly improved at the same time. Additionally, since there are almost no variations between characteristics of the piezoelectric layers 70, which constitute the piezoelectric element 300, characteristics of ejecting ink droplets from the respective nozzle orifices 21 become uniform.

Furthermore, the piezoelectric layer 70 preferably has a coercive electric field of Ec=20 to 30 kV/cm (2 Ec=40 to 60 kV/cm) and a residual polarization intensity of Pr=10 to 15 $\mu C/cm^2$ (2 Pr=20 to 30 $\mu C/cm^2$). Note that the residual polarization intensity Pr is a value, for example, obtained by use of the 2 Pr of the hysteresis loop of the piezoelectric layer as shown in FIG. 3.

In addition, it is preferable that the piezoelectric layer 70 meet conditions that the composition ratio thereof is Pb/(Zr+Ti)=1.05 to 1.5 and Zr/Ti=53/47 to 75/25. Furthermore, the piezoelectric layer 70 preferably has the perovskite structure.

The piezoelectric layer 70 is formed of lead zirconate titanate (PZT) in this embodiment. However it suffices that a piezoelectric material configuring the piezoelectric layer 70 contains at least lead (Pb), zirconium (Zr) and titanium (Ti) For example, preferably used is a piezoelectric material obtained by adding metallic oxide such as niobium oxide, nickel oxide or magnesium oxide to lead zirconate titanate (PZT), or the like.

Additionally, a protection plate 30 is joined to the top of the passage-forming substrate 10 over which such piezoelectric elements 300 are formed. In other words, the protection plate 30 is joined to the top of the lower electrode film 60, the elastic film 50 and the lead electrodes 90 with an adhesive agent or the like. The protection plate 30 is provided with a piezoelectric element holding portion 31 having a cavity large enough for the piezoelectric elements 300 to move without hindrance. The piezoelectric element holding portion 31 is provided to a region which is opposite the piezoelectric elements 300. Note that it suffices if the piezoelectric element holding portion 31 has a cavity large enough for the piezoelectric elements 300 to move without hindrance. It does not matter whether or not the cavity is sealed up. Moreover, the protection plate 30 is provided with a reservoir portion 32 in a region which is opposite the communicating portion 13. As described above, this reservoir portion 32 constitutes the reservoir 100 while communicating with the communicating portion 13 of the passage-forming substrate 10. The reservoir 100 functions as a common ink chamber for the pressure generating chambers 12. Furthermore, a through-hole 33 is provided to a region between the piezoelectric element holding portion 31 and reservoir portion 32 of the protection plate 30. The through-hole 33 penetrates through the protection plate, 30 in the thickness direction. In the through-hole 33, a part of lower electrode film 60 and tip portions of the respective lead electrodes 90 are exposed. Although it is not illustrated, an end of a connection wire extended from a drive IC is connected to the lower electrode film 60 and each of the lead electrodes 90.

It is preferable that a material having a thermal expansion coefficient almost equal to that of the passage-forming substrate 10 be used for the protection plate 30. Examples of the material include glass, a ceramic material and the like. In this embodiment, the protection plate 30 is formed using a single crystal silicon substrate which is the same material as that for the passage-forming substrate 10.

A compliance plate 40 configured of a sealing film 41 and a fixed plate 42 is joined to the top of the protection plate 30. In this regard, the sealing film 41 is made of a flexible material with a lower rigidity (for example, a polyphenylen sulfide (PPS) film with a thickness of 6 μm). One end of the reservoir portion 32 is sealed up by this sealing film 41. Furthermore, the fixed plate 42 is formed of a hard material such as a metal (for example, stainless steel (SUS) or the like with a thickness of 30 μm). A region of this fixed plate 42, which region is opposite the reservoir 100, is an opening portion 43 which is obtained by completely removing a portion corresponding to the region in the thickness direction. Accordingly, one end of the reservoir 100 is sealed up only by the sealing film 41 which is flexible.

Such an inkjet recording head according to this embodiment takes in ink from external ink supply means, which is not illustrated, and fills the interior ranging from the reservoir 100 through the nozzle orifices 21 with ink. Thereafter, the inkjet recording head applies a voltage between the lower electrode film 60 and each of the upper electrode films 80 corresponding to the pressure generating chambers 12, in accordance with recording signals from the drive circuit. Thus, the inkjet recording head deforms the elastic film 50, the lower electrode films 60 and the piezoelectric layers 70 with flexure. This deformation raises the pressure in each of the pressure generating chambers 12, and thereby ink droplets are ejected from the nozzle orifices 21.

Figure 4A:
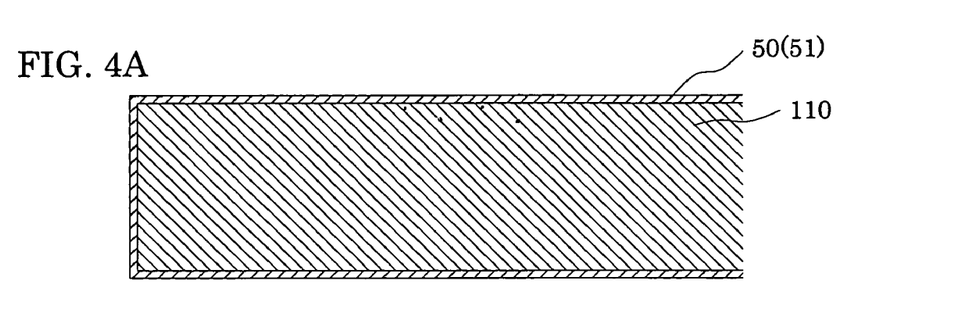
FIGS. 4A to 4D are cross-sectional views showing a method of manufacturing the recording head according to the first embodiment.

In this regard, a method of manufacturing the inkjet recording head will be described with reference to FIGS. 4A to 7C. Note that FIGS. 4A to 7C are cross-sectional views of the pressure generating chamber 12 in the longitudinal direction. First, as shown in FIG. 4A, a silicon dioxide film 51 is formed in a following manner. An wafer for passage-forming substrate 110 is thermally oxidized in a diffusion furnace at approximately 1100° C. Thereby, the silicon dioxide film 51, which will constitute the elastic film 50, is formed on the surface of the wafer for passage-forming substrate 110. Note that in this embodiment, silicon wafer which has a relatively large thickness as 625 μm and high rigidity is used as the wafer for passage-forming substrate 110.

Figure 4B:
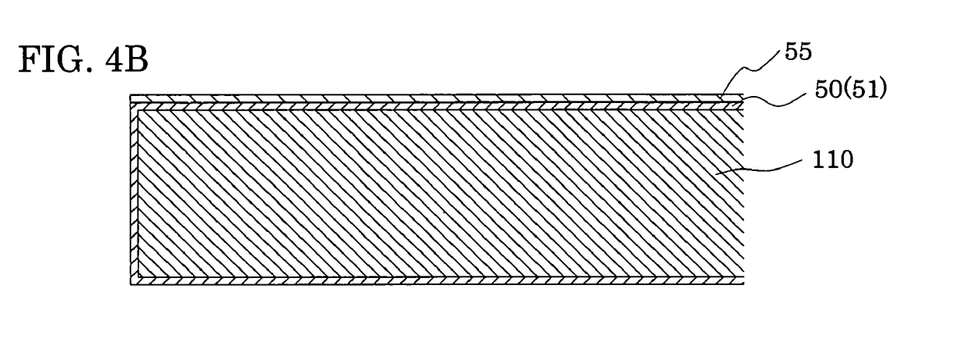
Figure 4C:
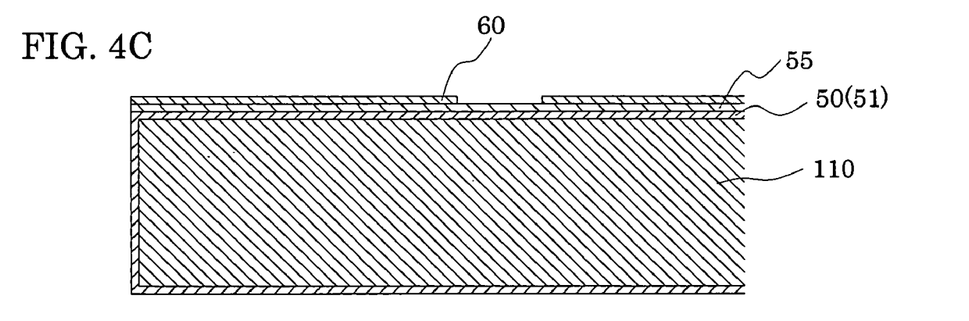

Subsequently, as shown in FIG. 4B, the insulation film 55 made of zirconia is formed on the elastic film 50 (the silicon dioxide film 51). Specifically, a zirconium (Zr) layer is formed on the elastic film 50 (the silicon dioxide film 51) by means of, for example, a sputtering method or the like. Thereafter, the zirconium layer is thermally oxidized, for example, in a diffusion furnace at approximately 500 to 1200° C. Thereby, the insulation film 55 made of zirconia ($ZrO_2$) is formed. Subsequently, the lower electrode film 60 formed of, for example, platinum (Pt), iridium (Ir) or the like is formed over the insulation film 55. Thereafter, as shown in FIG. 4C, the lower electrode film 60 is patterned in a predetermined shape.

Figure 4D:
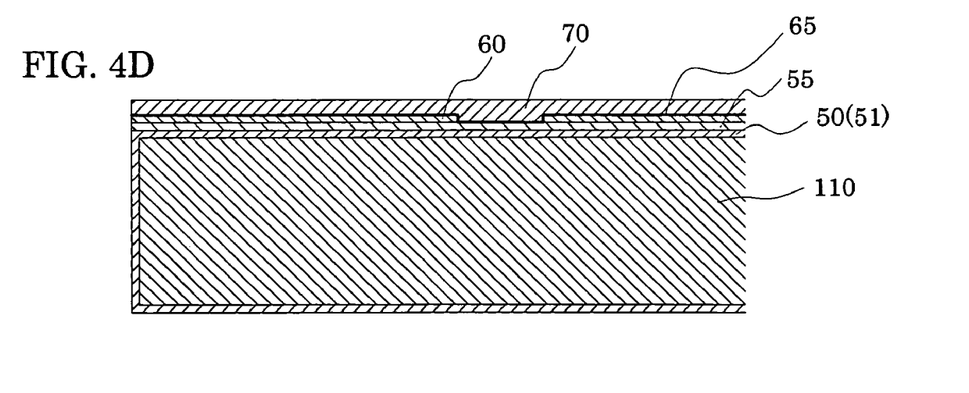

Subsequently, as shown in FIG. 4D, a seed titanium layer 65 having a predetermined thickness is formed over the lower electrode film 60 and the insulation film 55 by coating titanium (Ti) by use of, for example, a sputtering method or the like. Subsequently, the piezoelectric layer 70 is formed on the seed titanium layer 65. The piezoelectric layer 70 is made of lead zirconate titanate in this embodiment. In this regard, the piezoelectric layer 70 is formed by use of what is termed as a sol-gel method in this embodiment. According to the sol-gel method, what is termed as sol is obtained by dissolving and dispersing a metal-organic substance in a catalytic. This sol is coated and dried to be turned into gel. Then, the gel is sintered at a higher temperature. Thereby, the piezoelectric layer 70 made of a metal-oxide substance is obtained. In addition, the method of manufacturing the piezoelectric layer 70 is not limited to the sol-gel method. For example, the MOD (Metal-Organic Decomposition) method or the like may be used.

Figure 5A:
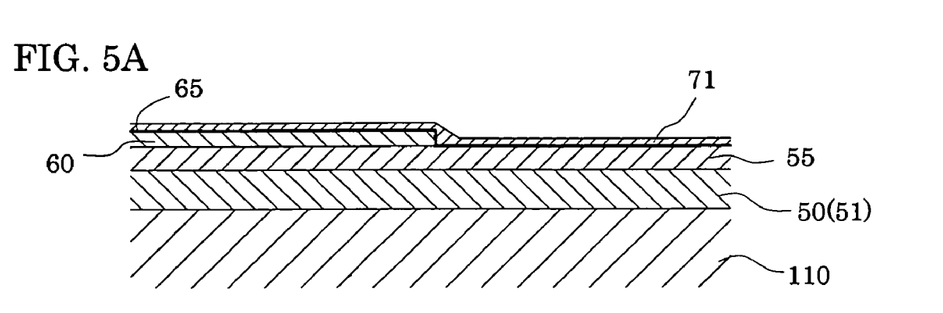
FIGS. 5A to 5C are cross-sectional views showing the method of manufacturing the recording head according to the first embodiment.

An example procedure for forming the piezoelectric layer 70 is as follows. As shown in FIG. 5A, a piezoelectric precursor film 71 which is a PZT precursor film is formed on the seed titanium layer 65. In other words, the sol (liquid solution) containing the metal-organic compound is coated to the top of the wafer for passage-forming substrate 110. Subsequently, the piezoelectric precursor film 71 is heated at a predetermined temperature, and thus is dried for a certain period. The piezoelectric precursor film 71 is dried by means of evaporating a solvent of sol. Further, the piezoelectric precursor film 71 is degreased in an atmosphere for a predetermined period at a predetermined temperature. Incidentally, the degreasing, which has been referred to in this respect, means that organic components of the film made from sol are eliminated therefrom, for example, as $NO_2$, $CO_2$, $H_2O$ and the like.

Figure 5B:
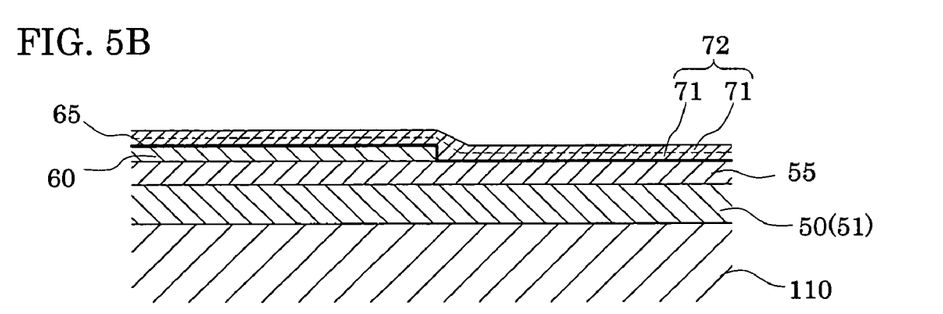

Subsequently, the coating, drying, and degreasing steps are performed for predetermined times, for example, twice. Accordingly, a piezoelectric film 72 is formed as shown in FIG. 5B in the following manner. The piezoelectric precursor films 71 each with a predetermined thickness are formed. Subsequently, the piezoelectric precursor films 71 undergo thermal processing in a diffusion furnace to be crystallized. Then, the piezoelectric film 72 is formed. In other words, the piezoelectric precursor films 71 are sintered to cause crystals thereof to grow with the seed titanium layer 65 as a seed, whereby the piezoelectric film 72 is formed. In this respect, a sintering temperature is preferably 650 to 850° C. For example, the piezoelectric precursor films 71 are sintered for half an hour at 700° C. to form the piezoelectric film 72. Note that crystals of the piezoelectric film 72 thus formed have preferred orientations of the (100) plane.

Figure 5C:
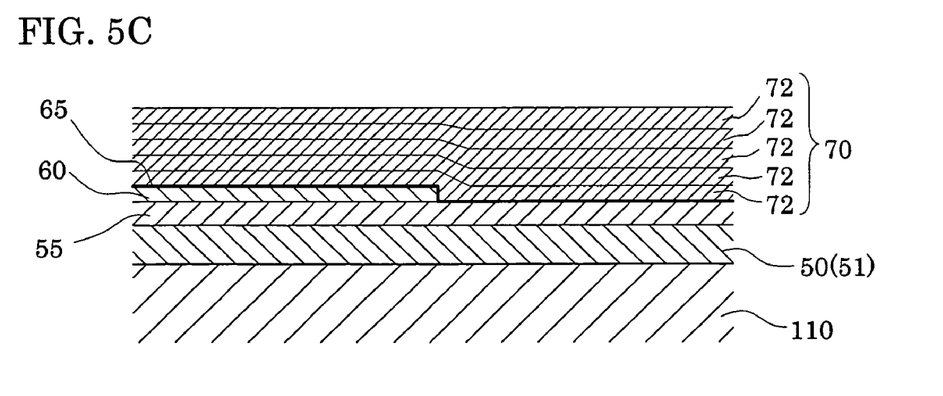

Furthermore, the coating, drying, degreasing, and sintering steps are repeatedly carried out for a plurality of times to form the piezoelectric layer 70 having a certain thickness. The piezoelectric layer 70 is formed of, for example, five piezoelectric films 72 as shown in FIG. 5C. Note that in a case of forming the piezoelectric layer 70 by performing the sintering for a plurality of times, it is preferable that the total sintering (heating) time be not more than half an hour to three hours.

Accordingly, by forming the piezoelectric layer 70 in this manner, it is possible to stably form the piezoelectric layer 70 with preferable characteristics including a relative permittivity of 750 to 1500 and a coercive electric field Ec of 10 to 40 kV/cm. Note that in a case where the piezoelectric layer 70 is formed under the conditions of this embodiment, the coercive electric field Ec and residual polarization intensity Pr of the piezoelectric layer 70 are approximately 20 to 30 (kV/cm) and approximately 10 to 15 ($\mu C/cm^2$) respectively.

Figure 6A:
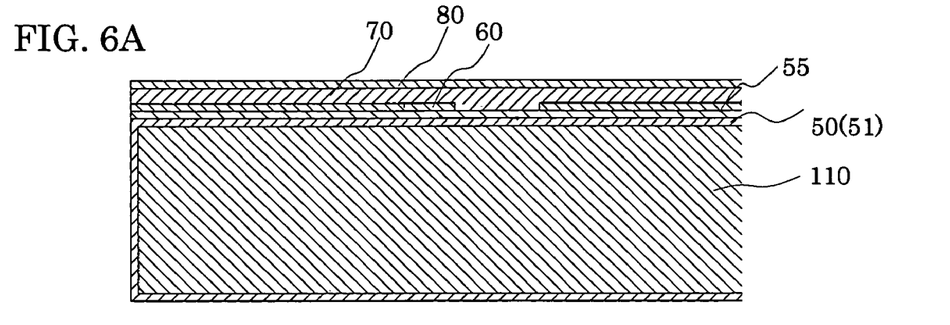
FIGS. 6A to 6D are cross-sectional views showing the method of manufacturing the recording head according to the first embodiment.
Figure 6B:
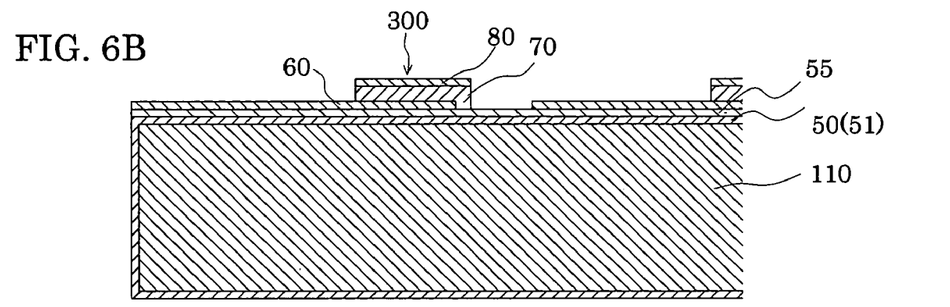

After the piezoelectric layer 70 is formed in this manner, the upper electrode film 80 is formed entirely on the top of the wafer for passage-forming substrate 110 as shown in FIG. 6A. The upper electrode film 80 is made of, for example, iridium. Subsequently, as shown in FIG. 6B, the piezoelectric element 300 is formed by patterning the piezoelectric layer 70 and the upper electrode film 80 in each of regions which are opposite the pressure generating chambers 12.

Figure 8:
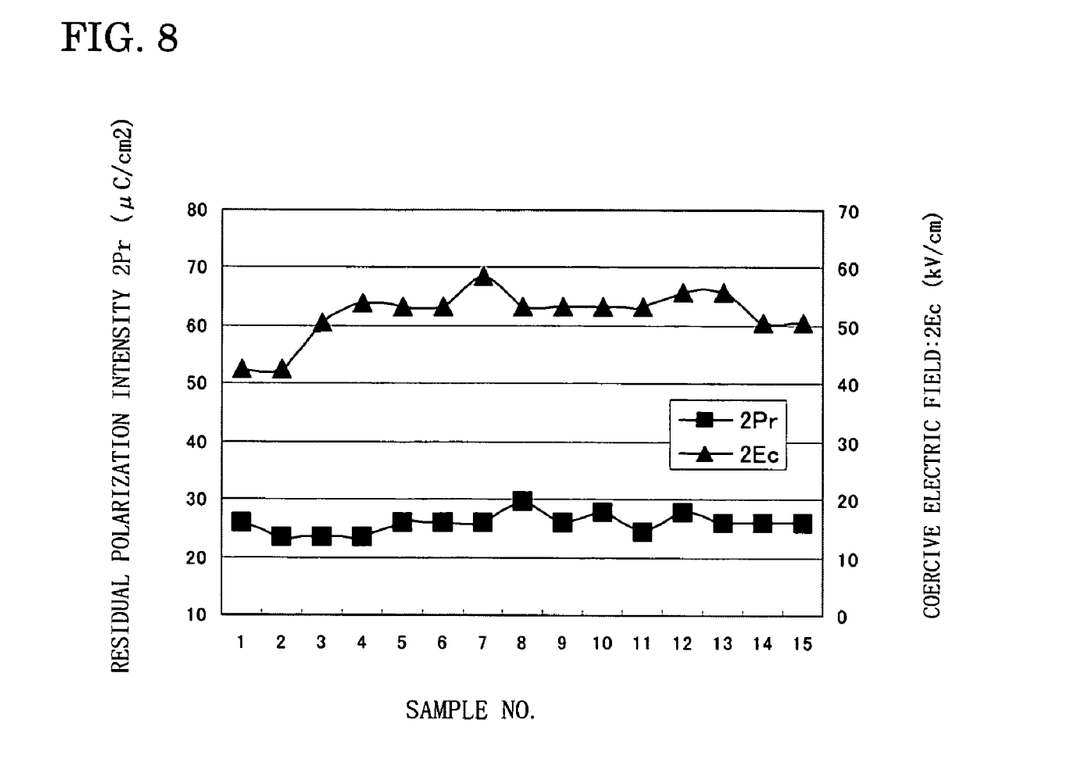
FIG. 8 is a graph showing residual polarization intensities and coercive electric fields of sample piezoelectric layers.

In this respect, a plurality of samples of piezoelectric element were prepared under the above-described conditions. FIG. 8 shows the results of measuring residual polarization intensity (2 Pr) and coercive electric fields (2 Ec) of the samples. As shown in FIG. 8, it is understood that, in each of the sample piezoelectric layers, the residual polarization intensity (2 Pr) is 20 to 30 ($\mu C/cm^2$) and the coercive electric field (2 Ec) is 40 to 60 (kV/cm).

In addition, such a piezoelectric layer 70 has a piezoelectric constant $d_{31}$ as high as 150 to 250 (pC/N) as described above, whereby the displacement characteristics of the piezoelectric element 300 are significantly improved. In addition, the piezoelectric layer 70 is also excellent in crystallinity, thus characteristics such as withstand voltage are also significantly improved, for example.

Figure 6C:
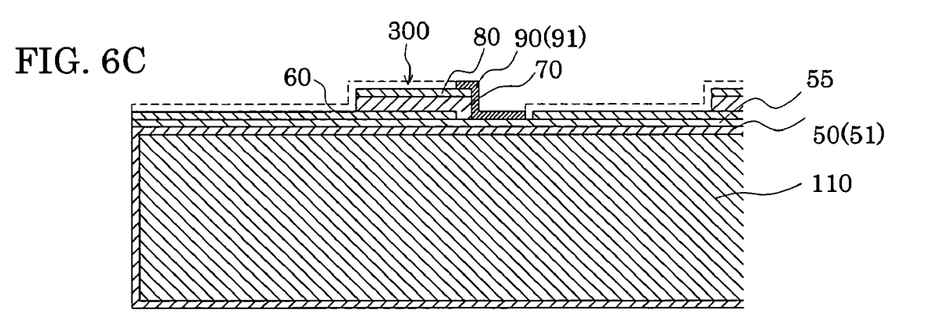

Note that after the piezoelectric elements 300 are formed, a lead electrode 90 drawn out from each of the piezoelectric elements 300 is formed. Specifically, the lead electrode 90 is formed as shown in FIG. 6C in the following manner. First, a metal layer 91 is formed the entire top surface of the wafer for passage-forming substrate 110. The metal layer 91 is made, for example, of gold (Au) and the like. Thereafter, the lead electrodes 90 are formed by patterning the metal layer 91 in each of the piezoelectric elements 300 by use of a mask pattern (not illustrated) made, for example, of a resist or the like.

Figure 6D:
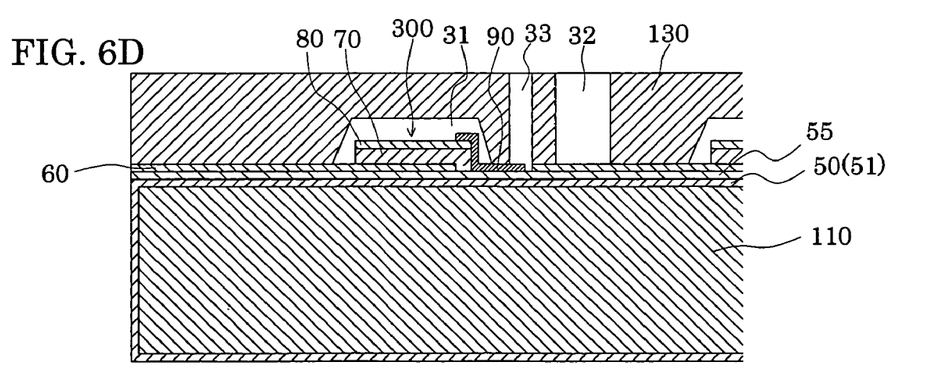

Next, as shown in FIG. 6D, a wafer for protection plate 130 is joined to the top of the wafer for passage-forming substrate 110 on the side where piezoelectric elements 300 are formed. The wafer for passage-forming substrate 110 is silicon wafer and is to become plural protection plates 30. The wafer for protection plate 130 has a thickness of, for example, approximately 400 μm. Note that, accordingly, rigidity of the wafer for passage-forming substrate 110 is significantly increased by joining the wafer for protection plate 130 to the wafer for passage-forming substrate 110.

Figure 7A:
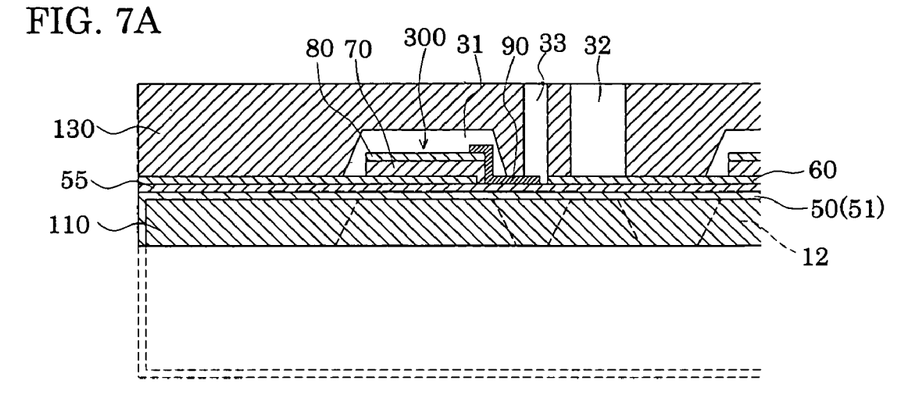
FIGS. 7A to 7C are cross-sectional views showing the method of manufacturing the recording head according to the first embodiment.
Figure 7B:
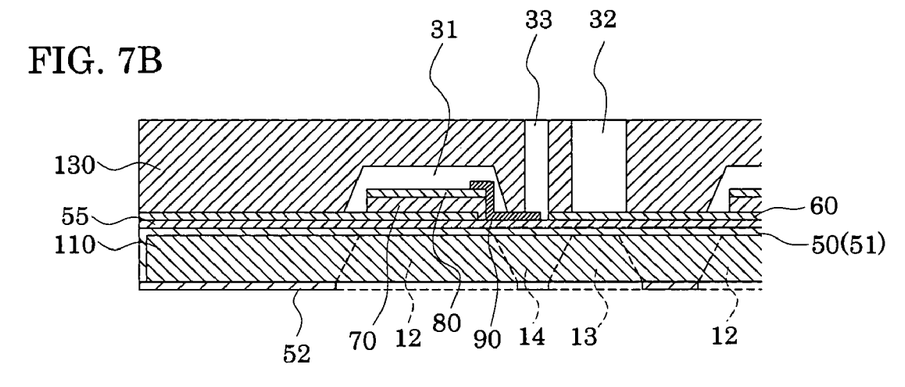
Figure 7C:
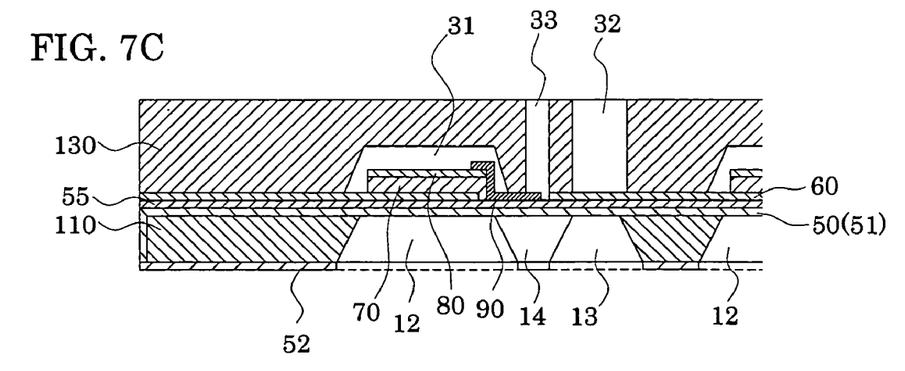

Subsequently, as shown in FIG. 7A, the wafer for passage-forming substrate 110 is caused to have a predetermined thickness by means of polishing the wafer for passage-forming substrate 110 and then performing wet-etching with fluoro-nitric acid. In this embodiment, the wafer for passage-forming substrate 110 undergoes etching processing in order that the wafer for passage-forming substrate 110 has a thickness of, for example, approximately 70 μm. Subsequently, as shown in FIG. 7B, a mask film 52 is newly formed on the bottom surface of the wafer for passage-forming substrate 110 and is patterned in a predetermined shape. The mask film 52 is made of, for example, silicon nitride (SiN). Thereafter, by anisotropically etching the wafer for passage-forming substrate 110, the pressure-generating chambers 12, the communicating portion 13, the ink supplying paths 14 and the like are formed in the wafer for passage-forming substrate 110 as shown in FIG. 7C.

Thereafter, unnecessary portions of periphery portions of both of the wafer for passage-forming substrate 110 and the wafer for protection plate 130 are cut by means of dicing or the like and are removed. Subsequently, the nozzle plate 20 is joined to a surface of the wafer for passage-forming substrate 110, the surface being opposite the surface to which the wafer for protection plate 130 has been joined. The nozzle orifices 21 are drilled in the nozzle plate 20. Concurrently, the compliance plate 40 is joined to the wafer for protection plate 130. Thereafter, the wafer for passage-forming substrate 110 and the like are divided into the passage-forming substrates 10 and the like each in a chip size as shown in FIG. 1. Thereby, the inkjet recording head of this embodiment is formed.

According to the present invention, as described above, the piezoelectric layer is formed configuring the piezoelectric element and having a relative permittivity of 750 to 1500 and a coercive electric field of 10 to 40 kV/cm. This increases the piezoelectric constant $d_{31}$ of the piezoelectric layer 70. Accordingly, the displacement characteristics of the piezoelectric element 300 improve. Furthermore, since the crystallinity of the piezoelectric layer 70 improves, characteristics such as the withstand voltage are significantly improved, for example. Accordingly, the displacement characteristics of the piezoelectric element 300 are improved while the durability life thereof is also significantly extended.

Figure 9:
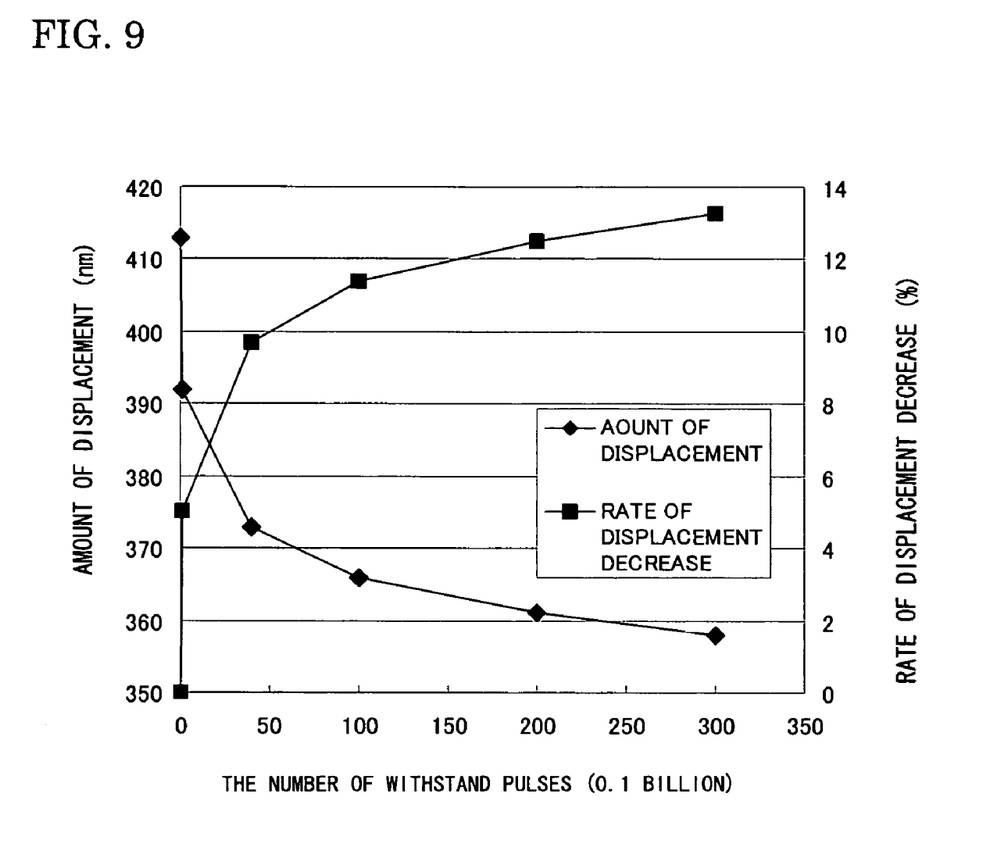
FIG. 9 is a graph showing an amount of displacement and a rate of displacement decrease of a sample piezoelectric element.

In this respect, a sample of piezoelectric element prepared under the above-mentioned conditions was caused to undergo a durability test in which a predetermined drive pulse is continuously applied to the sample thirty billion times. FIG. 9 shows the result of examining the amount of displacement of the piezoelectric element and a decrease in the displacement. Incidentally, with respect to the sample piezoelectric element, a piezoelectric layer, a lower electrode film and an upper electrode film had thicknesses of 1.5 μm, of 200 nm, of 50 nm respectively. Additionally, the drive pulse applied in the durability test was a sine wave with a voltage of 50V and a frequency of 100 kHz. A drive pulse applied during displacement measurement was a trapezoidal wave with a voltage of 30V and a frequency of 800 Hz.

As shown in FIG. 9, with respect to the piezoelectric element according to the present invention, the displacement amount is decreased in accordance with the increase in the number of the withstand pulses. In other words, although the rate of displacement decrease is increased. However, the rate of displacement decrease was kept to be a significantly low rate of 13.3%, even after the drive pulse is applied thirty billion times. As is clear form the results, the durability life of the piezoelectric element (piezoelectric layer) is significantly improved according to the present invention.

Other Embodiments

The first embodiment of the present invention has been described above. However, a basic configuration of an inkjet recording head is not limited to the aforementioned one. In the above-described first embodiment, for example, the piezoelectric layer is formed by use of the sol-gel method. However, the piezoelectric layer may be formed by means of a sputtering method, the CVD method or the like. In this case, piezoelectric precursor films are sintered at 650 to 750° C. Thereafter, post-annealing is performed on the piezoelectric precursor films for half an hour to three hours. Thereby, a piezoelectric film having characteristics similar to that of the first embodiment can be formed. Furthermore, among the plurality of piezoelectric films constituting the piezoelectric layer, the lower films may be formed by means of the sputtering or CVD method and the upper films may be formed by means of the sol-gel method, the MOD method or the like.

Figure 10:
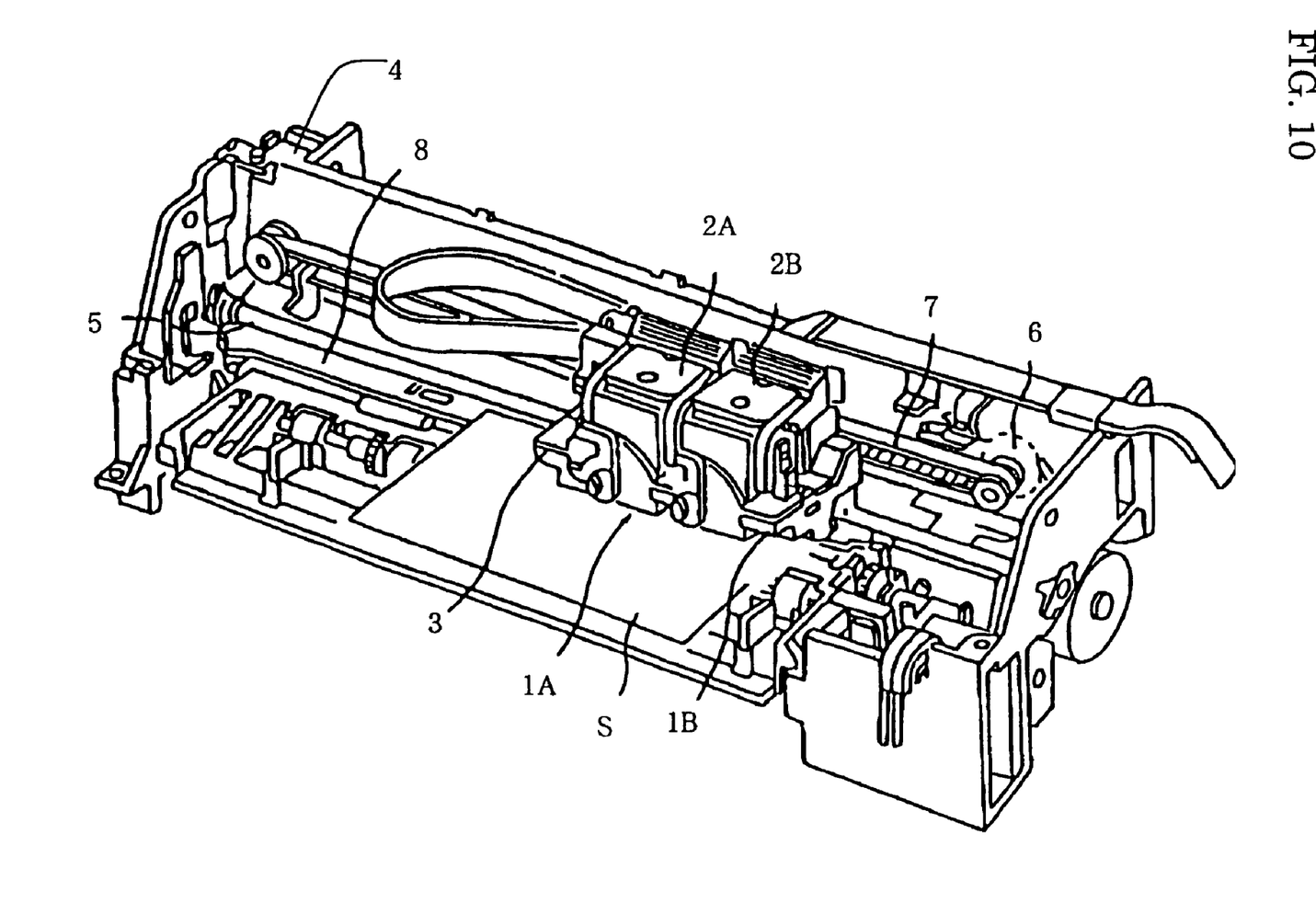
FIG. 10 is a diagram showing a schematic configuration of a recording device according to an embodiment.

In addition, each of the inkjet recording heads according to those embodiments constitutes a part of a recording head unit provided with an ink passage communicating with an ink cartridge and the like, and is installed in an inkjet recording apparatus. FIG. 10 is a schematic configuration diagram showing an example of the inkjet recording apparatus. As shown in FIG. 10, recording head units 1A and 1B each including the inkjet recording head are detachably provided to cartridges 2A and 2B constituting ink supply means. A carriage 3 on which the recording head units 1A and 1B are mounted is provided to a carriage shaft 5 fixed to the device main body 4 in a way that the carriage 3 can be freely moved in the direction in which the shaft extends. These recording head units 1A and 1B are, for example, assigned to eject black ink compositions and color ink compositions respectively.

In addition, a drive power from a drive motor 6 is transmitted to the carriage 3 though a plurality of gears, which are not illustrated, and a timing belt 7. Thereby, the carriage 3 on which the recording head units 1A and 1B are mounted is caused to move along the carriage shaft 5. On the other hand, the device main body 4 is provided with a platen 8 along the carriage shaft 5. A recording sheet S, which is a recording medium such as a sheet of paper, and which has been fed by feed rollers and the like, is designed to be transferred on the platen 8, the feed rollers being not illustrated.

Note that the present invention is intended to be widely applied to the entire range of liquid-jet heads, although the first embodiment has been described above giving the inkjet recording head as an example of liquid-jet heads. It goes without saying that the present invention can be applied to any liquid-jet head which ejects a liquid other than ink. Examples of liquid-jet head which eject a liquid other than ink includes various recording heads used for image recording devices such as printers; color-material-jet heads used for manufacturing color filters of liquid crystal display devices and the like; electrode-material-jet heads used for forming electrodes of organic EL display devices, FED (Field Emission Display) devices and the like; bio-organic-substance-jet heads used for manufacturing bio-chips; and the like. Furthermore, it goes without saying that the present invention can be applied not only to piezoelectric elements used for liquid-jet heads but also to piezoelectric elements installed in other various devices such as microphones, sounding bodies, various vibrators, calling devices or the like.

What is claimed is:

1. A liquid-jet head comprising:
a lower electrode provided to one surface side of a substrate;
a piezoelectric layer which is made of a piezoelectric material containing lead (Pb), zirconium (Zr) and titanium (Ti), and which is provided above the lower electrode; and
an upper electrode provided above the piezoelectric layer, wherein a relative permittivity of the piezoelectric layer is 750 to 1500, coercive electric field of the piezoelectric layer is 10 to 40 kV/cm, and a residual polarization intensity of the piezoelectric layer is 10 to 15 μC/cm².

2. The liquid-jet head according to claim 1, wherein the coercive electric field of the piezoelectric layer is 20 to 30 kV/cm.

3. The liquid-jet head according to claim 1, wherein the film thickness of the piezoelectric layer is 0.5 to 5 μm.

4. The liquid-jet head according to claim 1, wherein a composition ratio of the piezoelectric layer meets conditions of Pb/(Zr+Ti)=1.05 to 1.5 and Zr/Ti=53/47 to 75/25.

5. The liquid-jet head according to claim 1, wherein the piezoelectric material is lead zirconate titanate.

6. A liquid-jet head according to claim 1, further comprising
a passage-forming substrate, in which the piezoelectric element is provided to one surface side of the passage-forming substrate with a vibration plate interposed in between, and to which a pressure generating chamber communicating with a nozzle orifice for ejecting ink droplets is provided.

7. A liquid-jet apparatus comprising:
the liquid-jet head according to claim 1.

8. The liquid-jet head according to claim 1, further comprising:
a single-layered insulation film formed on an elastic film; and
the elastic film constituting a bottommost layer of the piezoelectric element.

9. The liquid-jet head according to claim 8, wherein the lower electrode and a portion of a bottom surface of the piezoelectric layer are formed on the single-layered insulation film.

10. The liquid-jet head according to claim 1, wherein the piezoelectric layer is formed by baking multi-layered piezoelectric precursor films approximately for half an hour at approximately 700° C.

11. The liquid jet head of claim 8 further comprising:
a passage-forming substrate, in which the piezoelectric element is provided to one surface side of the passage-forming substrate, and to which a pressure generating chamber communicating with a nozzle orifice for ejecting ink droplets is provided.

12. The liquid jet head of claim 9 further comprising:
a passage-forming substrate, in which the piezoelectric element is provided to one surface side of the passage-forming substrate, and to which a pressure generating chamber communicating with a nozzle orifice for ejecting ink droplets is provided.

13. The liquid jet head of claim 10 further comprising:
a passage-forming substrate, in which the piezoelectric element is provided to one surface side of the passage-forming substrate, and to which a pressure generating chamber communicating with a nozzle orifice for ejecting ink droplets is provided.

14. The liquid-jet apparatus comprising:
the liquid-jet head according to claim 11.

15. The liquid-jet apparatus comprising:
the liquid-jet head according to claim 12.

16. The liquid-jet apparatus comprising:
the liquid-jet head according to claim 13.

17. The liquid-jet head according to claim 1, wherein the piezoelectric constant $d_{31}$ is 150 to 250 (pC/N).

* * * * *